United States Patent
Chang et al.

(10) Patent No.: US 7,169,700 B2
(45) Date of Patent: Jan. 30, 2007

(54) METAL INTERCONNECT FEATURES WITH A DOPING GRADIENT

(75) Inventors: Chung Liang Chang, Hsin-Chu (TW); Ming Hsing Tsai, Chu-pei (TW); Winston Sue, Hsihchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 179 days.

(21) Appl. No.: 10/913,759

(22) Filed: Aug. 6, 2004

(65) Prior Publication Data

US 2006/0027460 A1 Feb. 9, 2006

(51) Int. Cl.
*H01L 21/4763* (2006.01)

(52) U.S. Cl. ............... 438/637; 438/638; 257/E21.586

(58) Field of Classification Search ........ 438/637–639; 257/E21.586
See application file for complete search history.

(56) References Cited

U.S. PATENT DOCUMENTS

| | | | | |
|---|---|---|---|---|
| 5,158,653 A | * | 10/1992 | Lashmore et al. .......... 205/103 |
| 6,022,808 A | * | 2/2000 | Nogami et al. ............. 438/694 |
| 6,130,156 A | * | 10/2000 | Havemann et al. ......... 438/637 |
| 6,525,425 B1 | * | 2/2003 | Woo et al. .................. 257/758 |
| 6,664,185 B1 | * | 12/2003 | Wang et al. ................ 438/659 |
| 6,731,006 B1 | * | 5/2004 | Halliyal et al. ............. 257/758 |
| 6,800,554 B1 | * | 10/2004 | Marieb et al. .............. 438/687 |
| 6,841,458 B1 | * | 1/2005 | Dubin et al. ................ 438/510 |

FOREIGN PATENT DOCUMENTS

WO WO 02/045142 * 2/2003

* cited by examiner

*Primary Examiner*—Asok Kumar Sarkar
(74) *Attorney, Agent, or Firm*—Tung & Associates

(57) ABSTRACT

A metal filled damascene structure with improved electromigration resistance and method for forming the same, the method including providing a semiconductor process wafer comprising damascene openings; and, depositing metal and at least one metal dopant according to an ECD process to from a metal filled damascene comprising a doped metal alloy portion.

26 Claims, 3 Drawing Sheets

METAL INTERCONNECT FEATURES WITH A DOPING GRADIENT

FIELD OF THE INVENTION

This invention generally relates to metallic electrodeposition methods and more particularly to gradiently doped metal interconnects and method of forming the same to improve the structural stability and resistance to electromigration of metal interconnects incorporated into integrated circuits.

BACKGROUND OF THE INVENTION

Sub-micron multi-level metallization is one of the key technologies for the next generation of ultra large-scale integration (ULSI). The multilevel interconnects that lie at the heart of this technology including for example, vias and metal interconnect lines, are required to withstand both thermal and electrical stresses over an extended period of time in order to form reliable integrated circuits. Formation of these interconnect features is very important to the success of ULSI and to the continued effort to increase circuit density and quality of integrated circuits.

Copper and copper alloys have become the metal of choice for filling sub-micron, high aspect ratio interconnect features in multi-level integrated circuits. As circuit densities increase, the widths of vias, contacts, and interconnect lines have decreased to sub-micron dimensions, whereas the thickness of the dielectric layers, through the use low-k (low dielectric constant) materials, have decreased at a slower pace. Consequently, the aspect ratios for the features, i.e., their height divided by width, has increased thereby creating additional challenges in adequately filling the sub-micron features with, for example, copper metal.

As a result of these process limitations, electrochemical plating (ECP), also referred to as electrochemical deposition (ECD) is a preferable method for filling copper interconnect structures such as via openings and trench line openings formed in multi-level semiconductor devices. Typically, electroplating uses a suspension of positively charged ions of deposition material, for example metal ions, in contact with a negatively charged substrate, as a source of electrons, to plate out the metal ions by an electrochemical reduction reaction onto the charged substrate, for example, a semiconductor wafer.

Metal ECD in general is a well-known art and can be achieved by a variety of techniques. Common designs of cells for electroplating a metal on semiconductor wafers involve positioning the plating surface of the semiconductor wafer within an electrolyte solution in juxtaposition to an anode to allow an electrolyte flow to impinge on the plating surface. The plating surface (cathode) and anode form an electricat circuit powered by a power supply such that metal ions in the electrolyte solution are reduced and plated out by an electrochemical reaction onto the conductive portion of the plating surface.

The addition of metal dopants to the electrolyte solution has been proposed in the prior art to add the metal dopants to plated copper features, for example copper interconnect features. Metal dopants added in prior art processes have typically focused on the addition of layers of metal dopants, for example lining the opening of a copper filled damascene to improve a resistance to electromigration of the copper into adjacent dielectric layers. While the addition of metal dopants has included various deposition processes including ECD, prior art processes have typically been accomplished by controlling the deposition electrical current to form homogeneously doped copper features where such methods rely strongly on the metal dopant concentration in the electrolyte to achieve a desired dopant concentration in the plated copper.

Several problems are created by prior art ECD processes including the inability to achieve desired dopant concentrations of certain metal dopants as well as requiring careful monitoring and control of the metal dopant concentration in the electrolyte to achieve a desired doping concentration.

There is therefore a need in the integrated circuit manufacturing art for an improved ECD method of depositing copper as well as copper dopants to achieve better control over desired dopant concentrations as well as forming copper interconnect features with desired metal dopant concentration profiles to achieve improved structural stability including a resistance to electromigration and stress induced migration of the copper filled interconnect features.

It is therefore among the objects of the present invention to provide an improved ECD method of depositing copper as well as copper dopants to achieve better control over desired dopant concentrations as well as forming copper interconnect features with desired metal dopant concentration profiles to achieve improved structural stability including a resistance to electromigration and stress induced migration of the copper filled interconnect features.

SUMMARY OF THE INVENTION

To achieve the foregoing and other objects, and in accordance with the purposes of the present invention, as embodied and broadly described herein, the present invention provides a metal filled damascene structure with improved electromigration resistance and a method for forming the same.

In a first embodiment, the method includes providing a semiconductor process wafer comprising damascene openings; and, depositing metal and at least one metal dopant according to an ECD process to from a metal filled damascene comprising a doped metal alloy portion.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

In the method and exemplary copper interconnect feature formed according to the present invention, the invention is explained by reference to an exemplary electrode assembly. It will be appreciated that the method and copper interconnect structure of the present invention may be formed by any copper plating system including an anode, and a cathode and at least one reference electrode, preferably having the ability to carry out pulsed waveform plating according to preferred embodiments.

Figure 1:
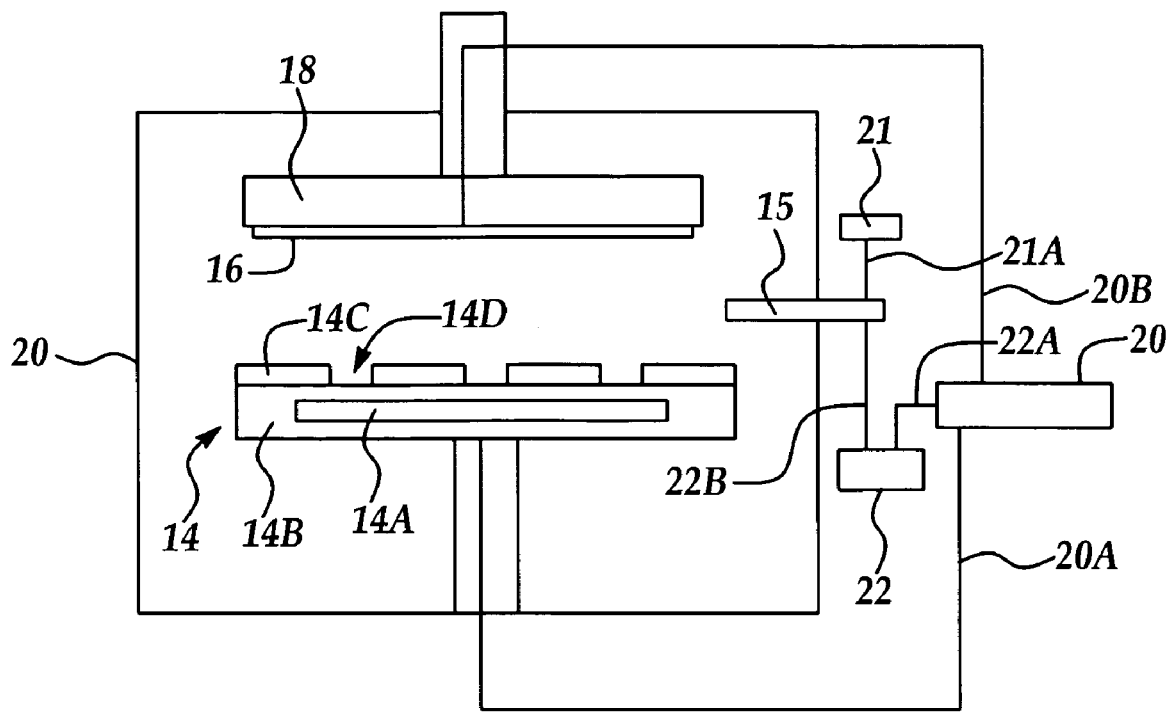
FIG. 1 is a conceptual schematic representation of an electrode assembly arrangement and ECD system for carrying out an ECD process according to an exemplary embodiment.

For example, referring to FIG. 1 is shown a schematic view of an exemplary copper electrochemical deposition (ECD) system for carrying out an ECD process according to embodiments of the present invention. A consumable copper or copper alloy anode 14, for example having a diameter about the same or larger than a process wafer is disposed in spaced apart relationship facing the cathode (process wafer) 16. The process wafer 16 is supported on a rotatable support e.g., 18, for example held in place by vacuum suction. The cathode and anode assemblies are housed in a container e.g., 20 for holding an electrolyte solution, also referred to as an electrolyte bath which fills the space between the cathode 16 and anode 14. The electrolyte bath preferably includes a copper electroplating solution, including for example, copper salts, e.g., copper sulfates, as well as other known additives. For example, levelers, brighteners, and suppressors as are known in the art may optionally be added to the electrolyte solution prior to or during the electrodeposition process.

The anode 14, for example, includes a copper or copper alloy core 14A surrounded by a nonconsumable metal plate 14B such as titanium and including openings in the upper portion (not shown) to allow copper or copper alloy ions from the core 14A to pass through into the electrolyte. An anode pad e.g., 14C covers the titanium plate 14B upper portion and includes openings e.g., 14D for directing a metal ion/electrolyte flow from the anode 14 surface. The anode 14 and cathode 16 are electrically connected to a power supply 20 e.g., communication lines 20A, 20B which is in electrical communication with a controller 22 e.g., communication line 22A.

Preferably, the power supply 20 in communication with the controller 22 delivers selectable amplitudes of anodic pulsed potentials (voltages) to the anode/cathode for a predetermined time period at a predetermined frequency to form an anodic forward pulsed waveform. For example, the anodic pulses may be delivered at a frequency of about 1 Hz to about 100 Hz at selected voltage potentials sufficient to achieve a desired overpotential to accomplish a desired reduction of a metal ion in solution onto the plating surface (cathode) 16. The power supply 20 in communication with the controller 22 also preferably has the ability to periodically deliver reverse pulses (cathodic potentials) in a reverse pulse waveform. During the electroplating (electrodeposition) process according to the present invention, the applied potential may be reversed in sign periodically during the deposition process to cause an electropolishing process to occur at the plating surface, for example a semiconductor wafer, including at the electrical contacts made to the wafer surface periphery (not shown) to remove undesired metal deposits.

In one aspect of the invention, at least a third reference electrode e.g., 15 is provided in contact with the electrolyte bath, for example extending to the periphery of the space between the anode 14 and cathode 16 to control the electrode and electrolyte bath potential during the deposition process. The reference electrode 15 may be any conventional electrode, but is preferably a non-consumable electrode, capable of determining a REDOX potential of the electrolyte solution. For example a conventional Ag/AgCl reference electrode or standard SCE reference electrode may be used to sense the potential of the cathode during the plating process. The reference electrode 15 is preferably powered by a separate power supply 21, e.g., communication line 21A, and in communication with the controller 22, e.g., communication line 22B, for sensing a REDOX potential of the cathode. The sensed cathode potential is then used by the controller 22 to determine an anodic potential to be delivered by power supply 20 to the anode/cathode electrode assembly to achieve a desired reduction rate of metal ions, e.g., copper and metal dopant, onto the cathode 16 (process wafer plating surface).

Figure 2A:
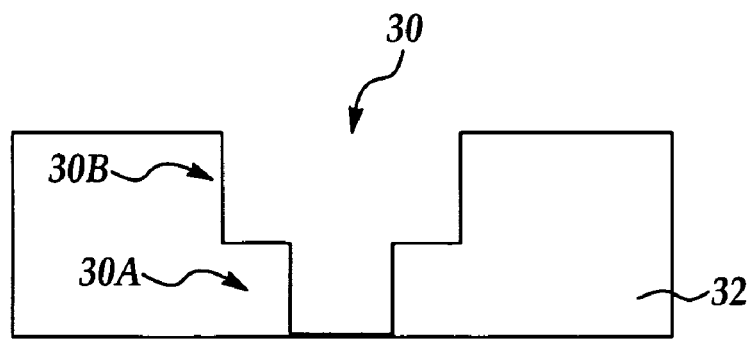
FIGS. 2A–2E are cross sectional views of a portion of a multi-level integrated circuit showing an exemplary metal damascene feature at stages in manufacture according to an embodiment of the present invention.

Referring to FIG. 2A, in an exemplary implementation of the method of the present invention to form a metal doped copper damascene structure is shown a cross sectional view of a portion of a multi-level integrated circuit including a damascene opening 30 formed in dielectric insulating layer 32 having a via portion 30A and an overlying trench line portion 30B. While there are several ways to form a dual damascene feature, one approach involves at least two photolithographic patterning and etching steps to first form a via opening e.g., 30A, followed by a similar process to form an overlying trench line opening 30B. The dual damascene feature 30 is formed in a dielectric insulating layer 32, for example a low dielectric constant (low-K) material, for example, carbon doped oxide or organo-silicate glass (OSG) formed by plasma enhanced CVD (PECVD).

Figure 2B:
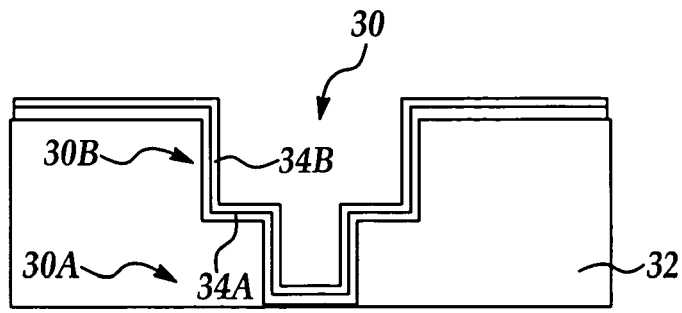

Referring to FIG. 2B, a barrier layer 34A, including one or more layers of a refractory metal, refractory metal nitride, or silicided refractory metal nitride, such as Ta, Ti, W, TaN, TiN, ITh, TaSiN, TiSiN, and WSiN is blanket deposited by known methods to include lining the damascene opening 30. Following barrier layer 34A deposition, a seed layer 34B of copper or copper alloy is conformally deposited over the barrier layer 34A by, for example, PVD or CVD. The copper seed layer 34B is preferably deposited to form a continuous layer for a subsequent copper ECP process whereby an electrical potential is applied to the seed layer by cathode contacts contacting, for example, the outer peripheral edges of the semiconductor wafer.

Figure 2C:
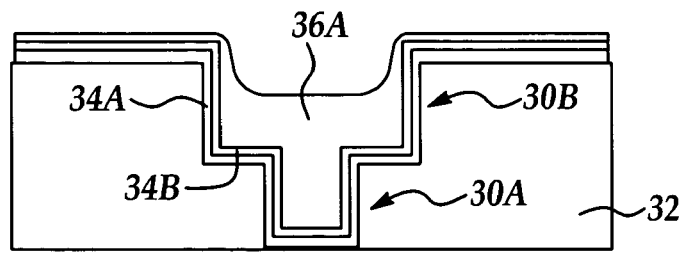

Referring to FIG. 2C, An ECD process according to an aspect of the present invention is then carried out whereby a forward pulsed (anodic) waveform is applied to the anode/cathode electrode assembly during the ECD process according to a desired cathode potential relative to the reference potential to deposit both copper and one or more selected metal dopants. It will be appreciated that the relative amount of copper and metal dopant deposited will depend on the copper ion (e.g., copper salt) and metal dopant ion (e.g., metal dopant salt) concentration, as well as their respective reduction potentials e.g., referenced to an SCE reference potential, and the voltage potential applied in the forward waveform.

In one aspect of the invention, a desired amount of metal dopant may be added to the electrolyte prior to or following the start of the ECP process to achieve a desired electrolyte metal dopant concentration. Preferably the metal dopant is deposited by applying a selected voltage potential (e.g., overpotential) to achieve a metal dopant concentration gradient from a lower portion of the damascene 30 to the upper portion of the damascene. For example the metal doping concentration preferably increases from a lowermost portion of the damascene to a selected filling level or uppermost portion of the damascene including achieving greater than about 90 atomic % including 100 atomic % of metal dopant at the uppermost portion of the damascene.

Still referring to FIG. 2C, in one embodiment a desired Voltage potential is applied in a forward pulsed plating method to deposit a first portion of the copper damascene e.g., 36A, to have a selected metal dopant concentration, if any, of one or more metal dopants at about 0 atomic (at) % to about 5 at %. The first portion of the copper damascene 36A may also be deposited by a constant current or unpulsed method, although a pulsed waveform method is preferred. For example, the first copper portion 36A may be deposited at about a constant metal dopant at % concentration profile or may be formed with a metal dopant concentration gradient increasing from a lower portion to an upper portion of the first portion of plated copper e.g., 36A. Any metal dopant capable of being solvated as a metal ion in an electrolyte solution and undergoing a reduction reaction to form a metal doped copper plated surface may be used. Preferred metal dopants include for example, Sn, Wn, Mg, Ag, Co, P, Pd, and Zn, introduced into the electrolyte according to known solvation methods including salts of the preferred metal dopants. The preferred metal dopants have been found to advantageously produce superior resistance to electromigration and stress induced migration of the copper.

Figure 2D:
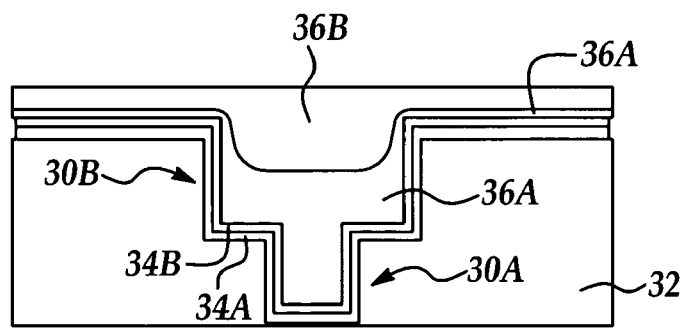

Referring to FIG. 2D, a second copper plated portion 36B is then deposited over the first copper plated portion 36A, to complete the filling of the damascene opening 30. The second copper plated portion 36B is preferably deposited with a lowermost portion having about $1\times10^{-4}$ atomic % to about 0.1 atomic % of one or more preferred metal dopants with respect to the plated material, the remaining portion being copper. The second copper plated portion 36B, is preferably deposited to form an increasing concentration gradient of metal dopant from a lower portion to an upper portion, for example increasing from about $1\times10^{-4}$ atomic % up to 100 atomic % of metal dopant, (e.g., substantially pure dopant metal or metals) at about the damascene opening level and above.

For example, in exemplary operation, referring back to FIG. 1, a beginning concentration of metal dopant present as a salt in the electrolyte is provided, followed by sensing a reduction (REDOX) potential of the cathode by the reference electrode 15. In response to the sensed cathode REDOX potential, a forward (anodic) pulsed waveform of a selected frequency and voltage amplitude (potential) is determined by the controller 22 and applied via the power supply 20 to the anode/cathode electrode assembly to accomplish plating of both copper and the metal dopant. The cathode is repeatedly sensed and the voltage amplitude adjusted to achieve a desired concentration gradient of the metal dopant in the plated copper. For example, the voltage potential is increased at a selected rate with respect to the sensed REDOX potential of the cathode to achieve a desired deposition rate of the metal dopant relative to copper deposition. It will be appreciated that the concentration of the metal dopant in the electrolyte will decrease during the plating operation unless refreshed, and may optionally be refreshed or increased either by adding metal salt to the electrolyte solution or may be refreshed from the consumable anodic electrode, for example a consumable anodic electrode 14 comprising one or more of the preferred metal dopants. More preferably, sufficient metal dopant concentration is present in the electrolyte at the beginning of the plating operation and the metal dopant concentration in the plated copper is controlled by altering (e.g., increasing) the applied voltage potential of the anodic pulsed waveform by a selected amount during the ECD process.

For example, it has been found that by controllably increasing the applied voltage potential of the anodic pulsed waveform by a selected amount determined with respect to the reference electrode (e.g., an overpotential), a plated metal dopant concentration may be more reliably controlled without the offsetting problem of achieving excessive plating rates by current control methods which lead to the formation of voids. In addition, it has been found that by using a forward pulsed waveform method, at least with respect to the upper plated portion e.g., 36B, that higher concentrations, including pure metal dopant e.g., about 100 atomic % at an upper portion of the damascene may be advantageously achieved without forming voids or other defects.

Figure 2E:
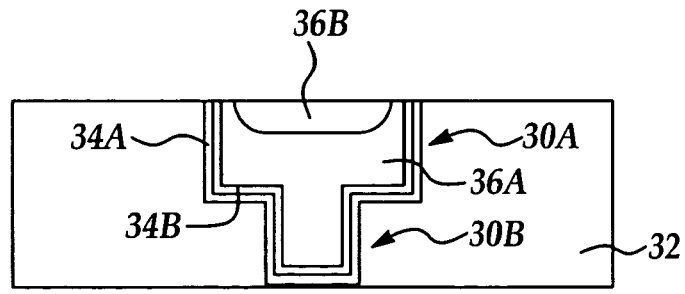

Referring to FIG. 2E, a CMP process is then carried out to remove the excess doped copper layer above the damascene opening level, including the barrier layer, to achieve a desired metal dopant concentration at an upper level of the damascene feature, including an uppermost portion having greater than about 90 atomic % metal dopant, including up to about 100 atomic % metal dopant.

Figure 3:
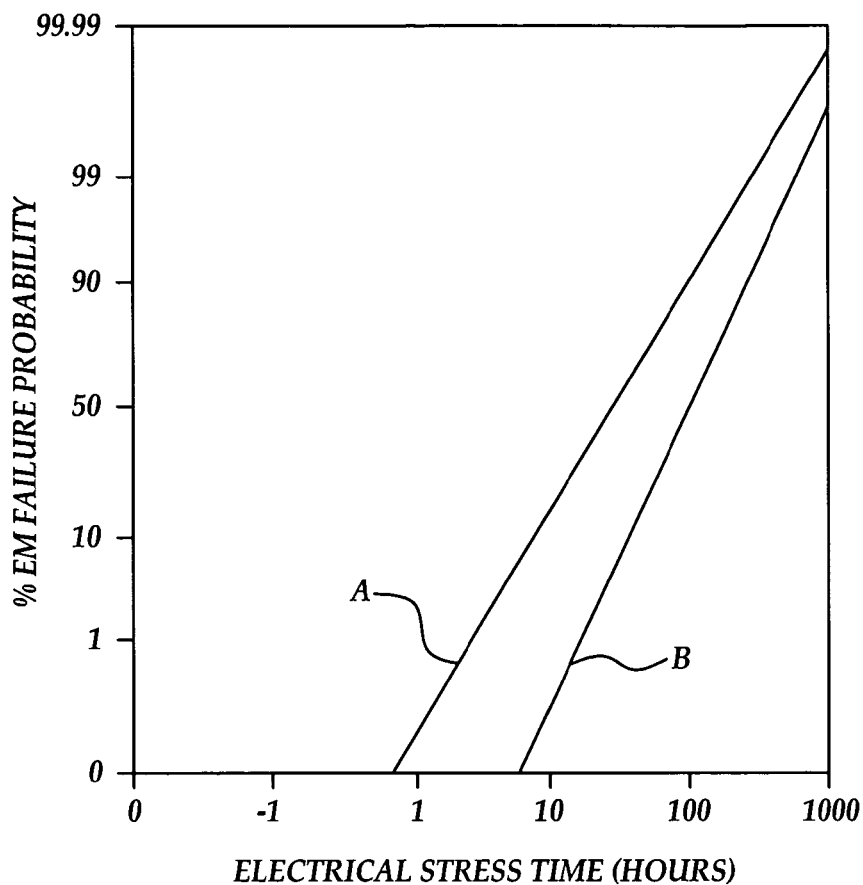
FIG. 3 is a representation of exemplary electromigration failure probability data for metal damascenes formed according to preferred embodiments.

Referring to FIG. 3 is shown an exemplary comparison of a Weibull plot showing a failure probability data with respect to electromigration of copper filled damascene features under electrical stress (e.g., applied electric field). The probability of failure is shown on the vertical axis and the hours of applied electrical stress, e.g., an applied electrical field to the copper filled damascene is shown on the horizontal axis. Line A represents a copper filled damascene without doping and line B represents a Sn doped copper damascene formed according to preferred embodiments including an increasing metal dopant concentration of Sn to greater than about 90 wt % at an upper portion of the copper filled damascene. The decrease in probability of failure at a selected time period of applied electrical stress demonstrates an improvement in stability by about a factor of 2 in damascenes formed according to preferred embodiments. Other exemplary metal dopants including adding a doped copper upper portion (cap) to a copper damascene having about 100% CoWP at an uppermost portion has been found to decrease the probability of failure for a given time period of applied electrical stress by about a factor of 6.

Figure 4:
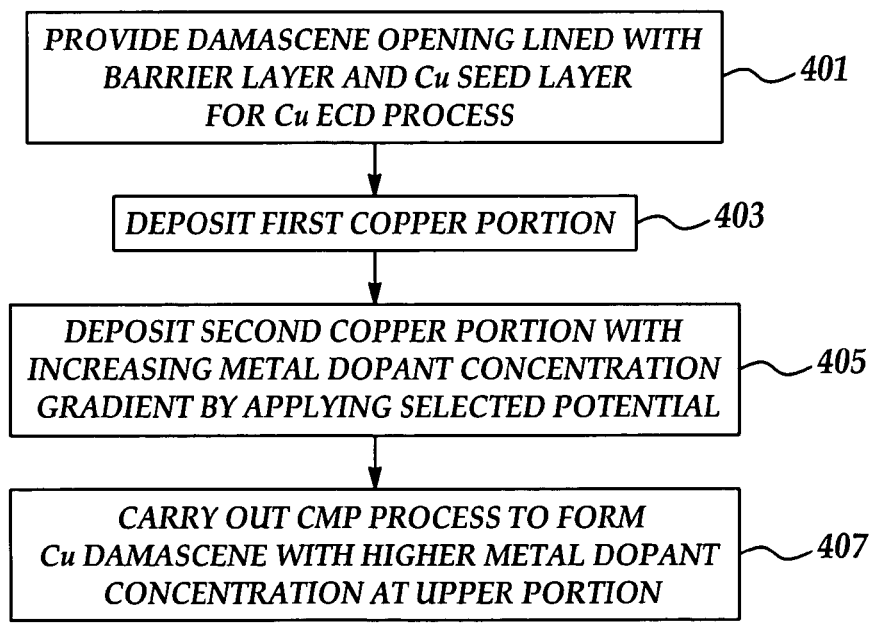
FIG. 4 is a process flow diagram including several embodiments of the present invention.

Referring to FIG. 4 is shown a process flow diagram including several embodiments. In process 401, a damascene opening formed in a dielectric insulating layer is provided including a barrier layer and a copper seed layer lining the opening for carrying out an ECD process. In process 403 a first copper portion is electrodeposited according to preferred embodiments. In process 405 a second copper portion including one or more metal dopants is deposited by applying a selected voltage potential to form a metal dopant gradient concentration with metal dopant concentration increasing in a direction toward an upper portion of the copper portion according to preferred embodiments. In process 407, a CMP process is carried out to form a copper damascene including a higher metal dopant concentration including 100 atomic % metal dopant at the upper portion of the copper damascene.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for carrying out an electrochemical deposition (ECD) process to form a doped metal damascene feature with improved electromigration resistance comprising the steps of:

providing a semiconductor process wafer comprising damascene openings; and, simultaneously depositing metal and at least one metal dopant according to an ECD process while filling said damascene openings to form a metal filled damascene comprising a doped metal alloy portion, said doped metal alloy portion comprising a dopant gradient increasing from a bottom portion of said doped metal alloy portion to a top portion of said doped metal alloy portion.

2. The method of claim 1, wherein the doped metal alloy portion comprises the uppermost portion of the metal filled damascene.

3. The method of claim 1, wherein a Voltage potential comprising an overpotential determined with reference to an electrolyte potential is adjusted in response to a measured electrolyte potential to deposit a desired concentration of the at least one metal dopant.

4. The method of claim 3, wherein the Voltage potential comprises an anodic forward pulsed waveform.

5. The method of claim 3, wherein a reference electrode is provided to measure the electrolyte potential.

6. The method of claim 1, wherein the doped metal alloy portion comprises the at least one metal dopant at a concentration of about 0.0001 atomic % to about 100 atomic %.

7. The method of claim 1, wherein the metal filled damascene is formed comprising a lowermost and an uppermost portion, said uppermost portion comprising said doped metal alloy portion, wherein said lowermost portion comprises a dopant concentration profile selected from the group consisting of a dopant concentration gradient increasing in an upward direction and a substantially constant dopant concentration including zero dopant concentration.

8. The method of claim 7, wherein the lowermost portion comprises the at least one metal dopant at a concentration of from about 0 atomic % to about 0.0001 atomic %.

9. The ECD metal filled damascene of claim 1, wherein an uppermost portion of the doped metal alloy portion comprises the at least one metal dopant at a concentration of greater than about 90 atomic %.

10. The method of claim 1, wherein the metal and the at least one metal dopant are selected from the group consisting of Cu, Sn, Wn, Mg, Ag, Co, P, Pd, and Zn.

11. The method of claim 1, wherein the metal comprises copper or an alloy thereof.

12. The method of claim 1, further comprising a CMP process to remove an upper portion of the doped metal alloy portion above the damascene opening level.

13. The method of claim 1, wherein the damascene opening further comprises a barrier layer and a seed layer.

14. The method of claim 1, comprising increasing the at least one metal dopant concentration in the electrolyte during the ECD process.

15. A method for carrying out an electrochemical deposition (ECD) process to form a doped copper damascene feature with improved electromigration resistance comprising the steps of:

providing a semiconductor process wafer comprising damascene openings; and, simultaneously depositing copper and at least one metal dopant while filling said damascene openings by an ECD process, said ECD process comprising an anodic pulsed waveform applied with an overpotential determined with reference to a measured electrolyte potential to form a copper filled damascene, said copper filled damascene comprises doped copper alloy portions comprising an uppermost portion having a first dopant concentration and a lowermost portion having a second dopant concentration, said second dopant concentration being smaller than said first dopant concentration.

16. The method of claim 15, wherein the uppermost portion comprises a dopant gradient increasing from a bottom portion of said uppermost portion to a top portion of said uppermost portion.

17. An ECD metal filled damascene with improved electromigration resistance comprising:

an ECD metal filled damascene comprising metal and at least one metal dopant forming a doped metal alloy portion, said doped metal alloy portion comprising a dopant gradient increasing from a bottom portion of said doped metal alloy portion to a top portion of said doped metal alloy portion.

18. The ECD metal filled damascene of claim 17, wherein the doped metal alloy portion comprises an uppermost portion of the metal filled damascene.

19. The ECD metal filled damascene of claim 17, wherein the doped metal alloy portion comprises the at least one metal dopant at a concentration of about 0.0001 atomic % to about 100 atomic %.

20. The ECD metal filled darnascene of claim 17, wherein the metal filled damascene is formed comprising a lowermost and an uppermost portion, said uppermost portion comprising said doped metal alloy portion, wherein said lowermost portion comprises a dopant concentration profile selected from the group consisting of a dopant concentration gradient increasing in an upward direction and a substantially constant dopant concentration including zero dopant concentration.

21. The ECD metal filled damascene of claim 20, wherein the lowermost portion comprises the at least one metal dopant at a concentration of from about 0 atomic % to about 0.0001 atomic %.

22. The ECD metal filled damascene of claim 17, wherein an uppermost portion of the doped metal alloy portion comprises the at least one metal dopant at a concentration of greater than about 90 atomic %.

23. The ECD metal filled damascene of claim 17, wherein the metal and at least one metal dopant are selected from the group consisting of Cu, Sn, Wn, Mg, Ag, Go, P, Pd, and Zn.

24. The ECD metal filled damascene of claim 17, wherein the metal comprises copper or an alloy thereof.

25. The ECD metal filled damascene of claim 17, wherein the metal filled damascene further comprises a barrier layer and a seed layer.

26. An ECD copper filled damascene with improved electromigration resistance comprising:

an ECD copper filled damascene comprising copper and at least one metal dopant forming a doped copper alloy portion comprising an uppermost portion having a dopant concentration of greater than 1 atomic %, said doped copper alloy portion comprising a dopant gradient increasing from a bottom portion of said doped copper alloy portion to a top portion of said doped copper alloy portion.

* * * * *